United States Patent
Furukawa

(12) United States Patent    (10) Patent No.: US 6,923,703 B2
(45) Date of Patent: Aug. 2, 2005

(54) METHOD OF MANUFACTURING PLASMA DISPLAY DEVICE

(75) Inventor: Hiroyuki Furukawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 156 days.

(21) Appl. No.: 10/354,988

(22) Filed: Jan. 31, 2003

(65) Prior Publication Data

US 2003/0157861 A1 Aug. 21, 2003

(30) Foreign Application Priority Data

Feb. 1, 2002 (JP) .......................... 2002-025128
Jun. 28, 2002 (JP) .......................... 2002-189339

(51) Int. Cl.$^7$ .............................. H01J 9/00; H01J 17/49
(52) U.S. Cl. ..................... 445/24; 445/25; 313/582; 313/584; 349/150; 349/187
(58) Field of Search ............. 445/24, 25; 349/149–152; 313/582–585, 495–497

(56) References Cited

U.S. PATENT DOCUMENTS 5,606,440 A * 2/1997 Kawaguchi et al. ........ 349/150
5,670,994 A * 9/1997 Kawaguchi et al. ........ 349/150
6,086,441 A    7/2000 Akiguchi et al. ............. 445/24

FOREIGN PATENT DOCUMENTS

JP         11-16502      1/1999
JP   2000348631 A * 12/2000 ............ H01J/11/02

* cited by examiner

Primary Examiner—Mariceli Santiago
(74) Attorney, Agent, or Firm—Wenderoth, Lind & Ponack, L.L.P.

(57) ABSTRACT

Provided is a method of manufacturing a plasma display device. The device comprises a plasma display panel that has a plurality of terminals formed on each of at least two sides thereof, and a plurality of circuit boards to be connected to the terminals. In application of adhesive to the front faces and back faces of the circuit boards, the adhesive is applied to one of the sides having the circuit boards disposed at smaller intervals, and then to one of the sides having the circuit boards disposed at larger intervals. Alternatively, the adhesive is applied to a long side of the plasma display panel, and then to a short side thereof.

12 Claims, 11 Drawing Sheets discharge space

METHOD OF MANUFACTURING PLASMA DISPLAY DEVICE

BACKGROUND OF THE INVENTION

1. Field of the Invention

The present invention relates to a method of manufacturing a plasma display device.

2. Background Art

Well known as a thin and light display having a large screen is a plasma display device using a plasma display panel. The plasma display panel is structured so that phosphor layers are formed in display cells partitioned by barriers on a substrate. In the plasma display panel, ultraviolet rays generated by gas discharge excite the phosphor layers and cause them to emit light for color display.

The plasma display panel has two types of discharge systems, i.e. surface discharge type and opposite discharge type. Drive systems thereof include an AC-driven type and a DC-driven type. At present, mainly used is a plasma display panel of AC-driven surface discharge type having a three-electrode structure because it provides high definition, and is suitable for a large screen and easily manufactured. A plasma display panel of this type is structured to have display electrodes, each comprising a pair of a scan electrode and a sustain electrode, on one substrate. On the other substrate, the plasma display panel has address electrodes and barriers arranged in the direction intersecting the display electrodes, and phosphor layers formed between the barriers. This structure can make the phosphor layers relatively thick and thus is suitable for color display using phosphor layers.

In the plasma display device, the display electrodes and address electrodes of the plasma display panel (hereinafter referred to as a "panel") and electrical circuits for driving and controlling the electrodes are connected, using flexible printed circuit boards (hereinafter abbreviated as an "FPC"). Specifically, the display electrodes and address electrodes are lead to terminals, each formed on an edge of the substrate. The terminals and the wiring patterns of the FPCs are heat-bonded via anisotropic conductive material so as to provide electrical continuity therebetween. Further, application of adhesive to the joints between the terminals and the FPCs secures adhesion and hermeticity of the joints.

The present invention aims to provide a manufacturing method of appropriately applying adhesive to the joint between the FPCs and each of the substrates of the panel with high workability.

SUMMARY OF THE INVENTION

In order to achieve this object, in accordance with an aspect of the present invention, there is provided a method of manufacturing a plasma display device. The device includes: a panel having a plurality of terminals formed on each of a plurality of sides; and a plurality of wiring boards to be connected to the terminals. In the method of manufacturing a plasma display panel, when adhesive is applied to the front faces and back faces of the circuit boards, the adhesive is applied to the sides having circuit boards disposed at smaller intervals first and then to the sides having circuit boards disposed at larger intervals.

In accordance with another aspect of the present invention, there is provided a method of manufacturing a plasma display device. The device includes: a panel having a plurality of terminals formed on each of long sides and short sides; and a plurality of circuit boards to be connected to the terminals. In the method of manufacturing a plasma display panel, when adhesive is applied to the front faces and back faces of the circuit boards, the adhesive is applied to the long sides of the panel first and then to the short sides thereof.

DETAILED DESCRIPTION OF THE INVENTION

A description is provided of a method of manufacturing a plasma display panel in accordance with an exemplary embodiment of the present invention hereinafter with reference to the accompanying drawings.

Figure 1:
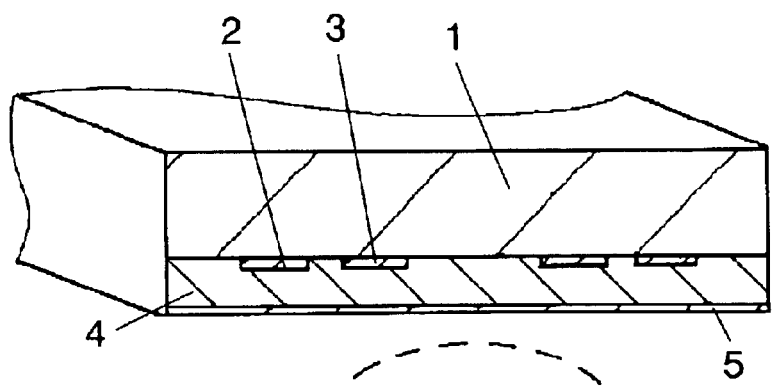
FIG. 1 are perspective views each illustrating a structure of a plasma display panel for use in a plasma display device in accordance with an exemplary embodiment of the present invention.
Figure 1:
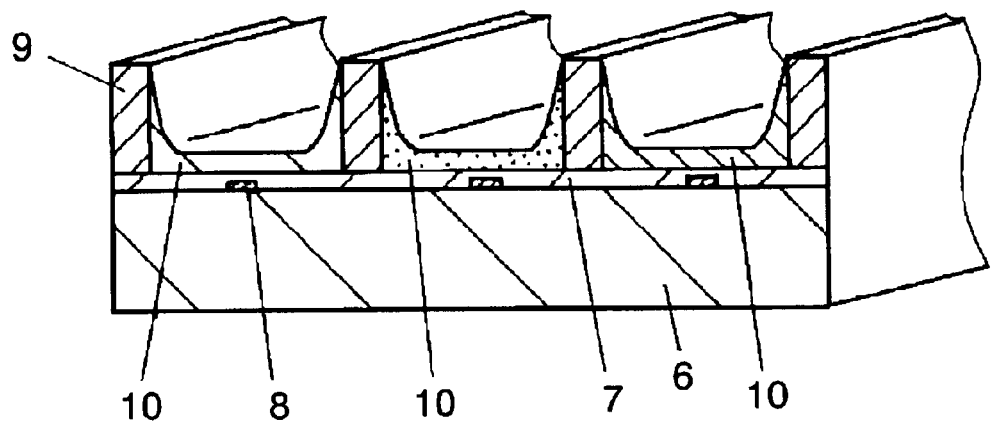

First, a description is provided of a structure of a plasma display panel (panel) for use in the plasma display device, referring to FIG. 1. A plurality of stripe-like display electrodes, each comprising a pair of scan electrode 2 and sustain electrode 3, are formed on a first substrate, i.e. transparent front plate 1, such as a glass substrate. Dielectric layer 4 is formed to cover the display electrodes. Additionally, protective layer 5 is formed over dielectric layer 4.

On a second substrate, i.e. back plate 6, a plurality of rows of stripe-like address electrodes 8 are formed. Overcoat layer 7 covers the address electrodes. Additionally, a plurality of barriers 9 are disposed on overcoat layer 7 between adjacent address electrodes 8 in parallel with address electrodes 8. Provided on the sidewalls of barriers 9 and the surface of overcoat layer 7 are phosphor layers 10.

Front plate 1 and back plate 6 are opposed to each other, sandwiching a small discharge space so that each pair of scan electrode 2 and sustain electrode 3 intersects the corresponding address electrode 8 substantially at right angles. The peripheries of the front and back plates are sealed and the inside thereof is filled with a mixed gas (e.g. neon and xenon) as a discharge gas. The discharge space is partitioned into a plurality of compartments by barriers 9. As for each of the compartments, read, green, and blue phosphor layers 10 are disposed in turn. Each intersection between a pair of scan electrode 2 and sustain electrode 3 and address electrode 8 forms a discharge cell. Three adjacent discharge cells having red, green, and blue phosphor layers 10 constitute one pixel for color display.

When such a panel is used, selective write pulses are applied between address electrodes 8 and scan electrodes for address discharge and then periodic sustain pulses are applied between scan electrodes 2 and sustain electrodes 3 for sustain discharge. Thereby, specified images can be displayed.

Figure 2:
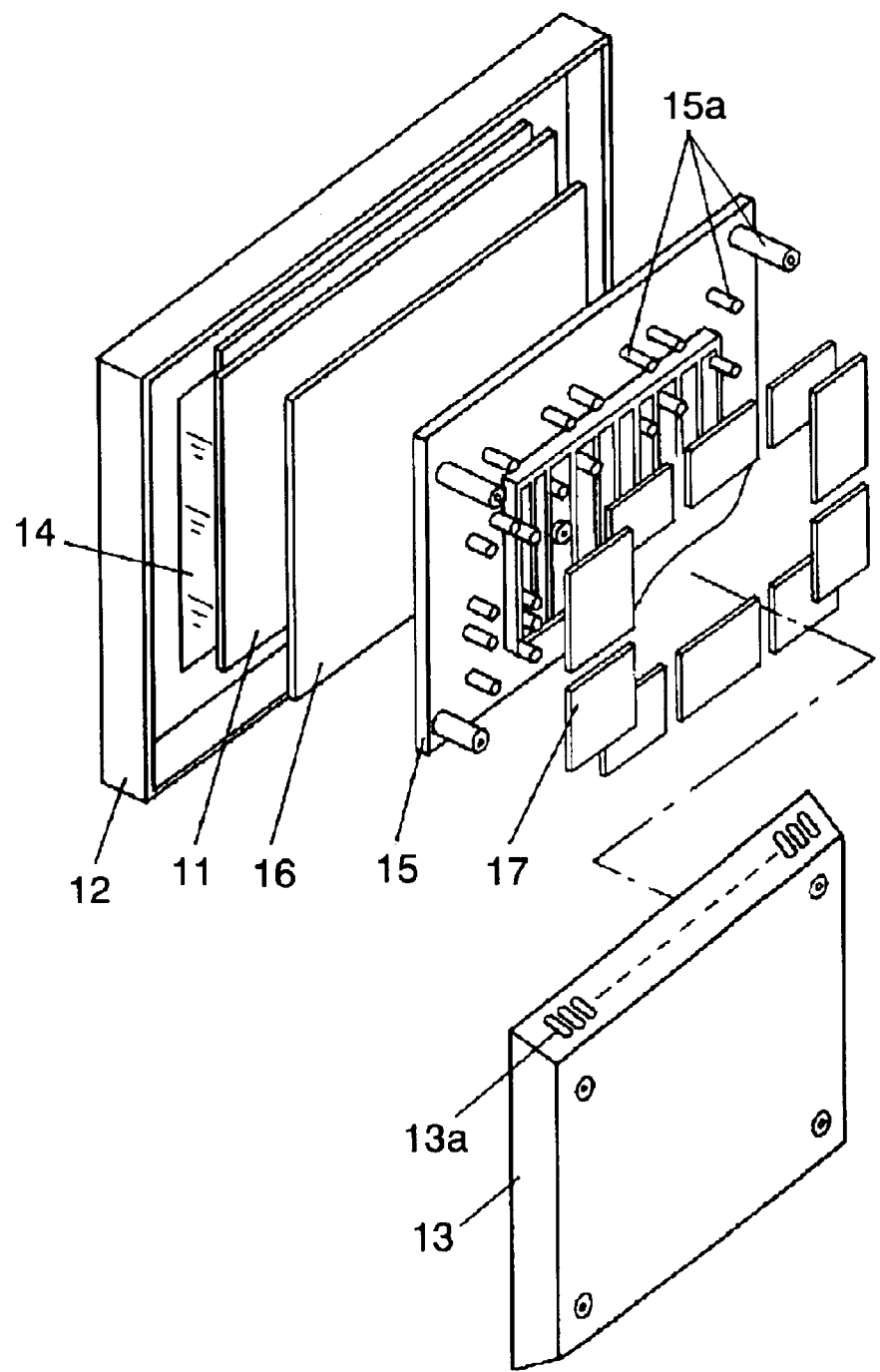
FIG. 2 is an exploded perspective view illustrating a structure of the plasma display device.

FIG. 2 is an exploded perspective view showing an example of a structure of a plasma display device using the above panel. The housing for receiving panel 11 comprises front frame 12 and metallic back cover 13. Disposed in the opening of front frame 12 is front cover 14 of glass or other material that protects panel 11 and also serves as an optical filter. Front cover 14 is subjected to a silver deposition process, for example, in order to inhibit unnecessary radiation of electromagnetic waves. Additionally, back cover 13 has a plurality of venting holes 13a for releasing heat generated by panel 11 and other components to the outside.

Panel 11 is held by being bonded to the front face of chassis 15 via heat conductive sheet 16. Heat conductive sheet 16 serves to efficiently transfer heat generated by panel 11 to chassis 15. Attached to the back face of chassis 15 are a plurality of circuit blocks 17. Circuit blocks 17 have electrical circuits for driving and controlling panel 11. The electrical circuits are electrically connected to electrode lead groups formed on the edges of panel 11 by a plurality of FPCs (not shown).

In this embodiment, on the back face of chassis 15, bosses 15a for mounting circuit blocks 17 and fixing back cover 13 are integrally formed by die-casting or other method so as to project therefrom. Alternatively, these bosses 15a can be made by attaching steady pins to a flat aluminum sheet.

Figure 3:
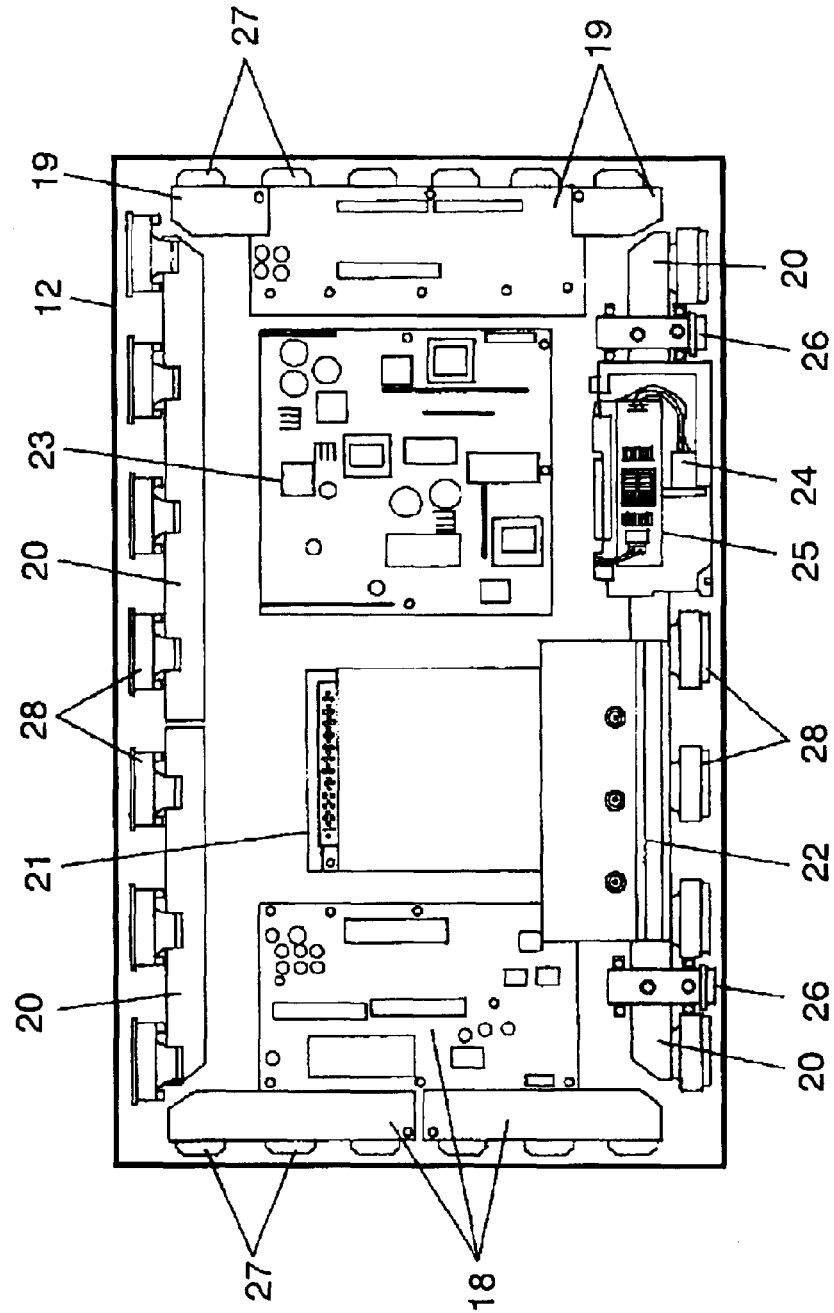
FIG. 3 is a plan view illustrating a structure of the plasma display device.

FIG. 3 is a plan view illustrating a structure of the plasma display device seen from the back face thereof with back cover 13 removed. Scan driver circuit blocks 18 supply predetermined signal voltages to scan electrodes of panel 11. Sustain driver circuit blocks 19 supply predetermined signal voltages to sustain electrodes of panel 11. Address driver circuit blocks 20 supply predetermined signal voltages to address electrodes of panel 11. Scan driver circuit blocks 18 and sustain driver circuit blocks 19 are disposed along the left and right edges of chassis 15, respectively. Address driver circuit blocks 20 are disposed along top and bottom edges of chassis 15.

Control circuit block 21 converts image signals supplied from input-signal circuit block 22 that is connected to an external device, e.g. a television tuner, into image data signals, according to the number of pixels of panel 11, and supplies the image data signals to address driver circuit blocks 20. Control circuit block 21 also supplies discharge control timing signals to scan driver circuit blocks 18 and sustain driver circuit blocks 19. With these actions, control circuit block 21 performs drive control, e.g. gradation control, and is disposed at substantially the center of chassis 15.

Power source block 23 supplies power to each of the above circuit blocks while obtaining the power from a commercial power source via a power cable (not shown), connector 24, and power input block 25. Like control circuit block 21, power source block 23 is disposed at substantially the center of chassis 15.

Brackets 26 are used for attaching a stationary stand to chassis 15 to hold the panel as it stands. Brackets 26 are attached to the bottom edge of chassis 15. The end of each stand pole attached to the stand is inserted into the hole of each bracket 26 and secured by machine screws or the like.

With reference to FIG. 3, left FPCs 27 of first circuit boards (FPCs) connect the electrode lead groups of scan electrodes 2 of panel 11 and the printed circuit boards on scan driver circuit blocks 18. Right FPCs 27 connect the electrode lead groups of sustain electrodes 3 and the printed circuit boards on sustain driver circuit blocks 19. Second circuit boards, i.e. FPCs 28, connect the electrode lead groups of address electrodes 8 and the printed circuit boards on address driver circuit blocks 20. These FPCs 27 and 28 are disposed so as to be bent at an angle of 180° or folded back from the electrode lead group side to the circuit block side.

Figure 4A:
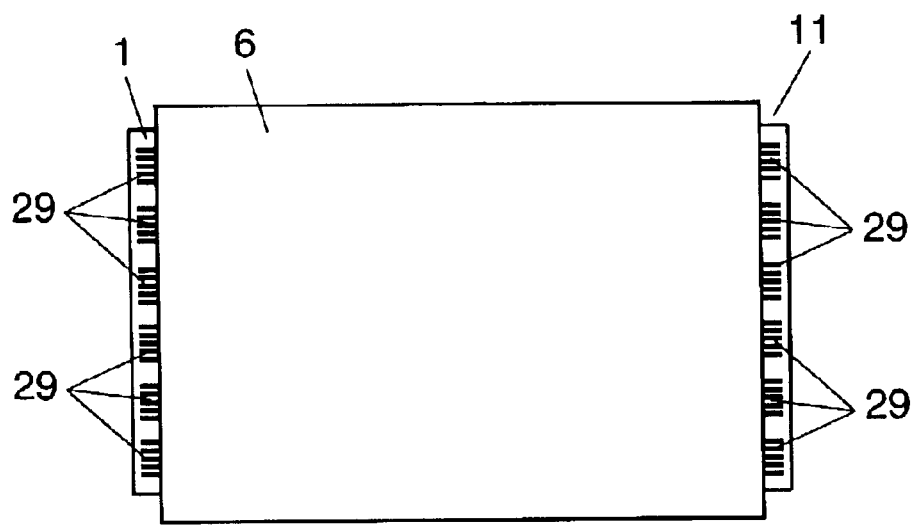
FIG. 4A is a plan view of the panel seen from a back face thereof before attachment of FPCs.
Figure 4B:
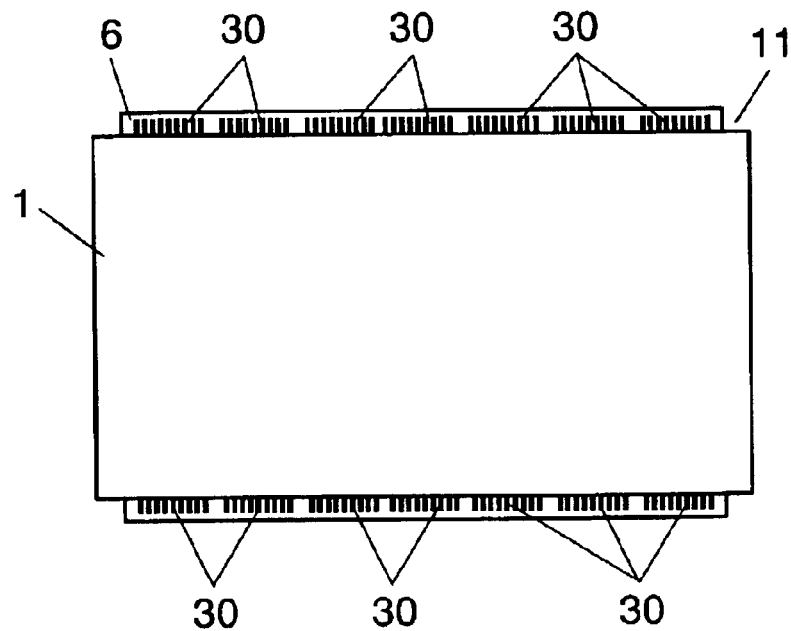
FIG. 4B is a plan view of the panel seen from a front face thereof before attachment of FPCs.

FIG. 4 are plan views each illustrating panel 11 before attachment of FPCs 27 or 28. FIG. 4A is a drawing of panel 11 seen from the back face thereof. FIG. 4B is a drawing of panel 11 seen from the front face thereof. Front plate 1 and back plate 6 of panel 11 are shaped substantially rectangular and have long sides and short sides. As shown in FIG. 4A, electrode lead groups 29 are disposed on the right and left edges, i.e. the short sides of front plate 1, where a predetermined number of terminals that connect to scan electrodes 2 or sustain electrodes 3 formed horizontally like stripes are arranged. These electrode lead groups 29 form a plurality of blocks. Each FPC 27 is connected to each electrode lead group 29. As shown in FIG. 4B, electrode lead groups 30 are disposed on the top and bottom edges, i.e. the long sides of back plate 6, where a predetermined number of terminals that connect to address electrodes 8 formed vertically like stripes are arranged. These electrode lead groups 30 form a plurality of blocks. Each FPC 28 is connected to each electrode lead group 30. The reason why electrode lead groups 30 are provided on both top and bottom edges is that address electrodes 8 are cut in the center of the vertical direction of back plate 6. In other words, address electrodes 8 are divided into the upper and lower half regions of panel 11. Thus, this panel 11 is used for the so-called dual scanning system in which scan electrodes 2 perform sequential scanning operations in the upper and lower half regions of panel 11 at substantially the same timing.

Figure 5:
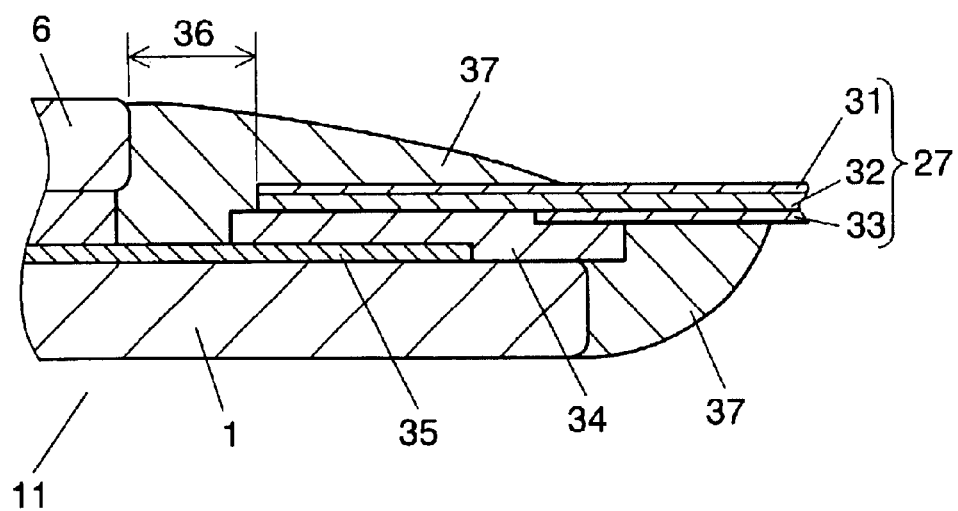
FIG. 5 is a sectional view of a portion in which an FPC is attached to a front plate.

FIG. 5 is a sectional view of a portion in which FPC 27 is attached to front plate 1. A portion in which FPC 28 is attached to back plate 6 has a similar structure, although it is not shown. As shown FIG. 5, FPC 27 is structured so that a plurality of wiring patterns 32 made of copper foil and other material are formed on base film 31 made of insulating and flexible resin, e.g. polyimide, and the wiring patterns are covered with cover film 33 made of resin, e.g. polyimide, except for both ends of the joints. Wiring patterns 32 are connected to terminals 35 provided in electrode lead group 29, via anisotropic conductive material 34. As for anisotropic conductive material 34, conductive particles, such as nickel, are dispersed in an insulating material. Anisotropic conductive material 34 does not have electrical conductivity in ordinary conditions. However, when it is sandwiched between front plate 1 and FPC 27 and the insulating material is broken by heat bonding, the conductive particles bond terminal 35 and wiring patterns 32 together to provide electrical continuity therebetween.

As shown in FIG. 5, FPC 27 is fixed so that a predetermined space 36 is provided between the end of FPC 27 and the edge of back plate 6. Adhesive 37 is applied to the side of base film 31 of FPC 27 (front face of FPC 27) so as to cover the portion of space 36 beside anisotropic conductive material 34 and over terminal 35. Adhesive 37 is also applied to the side of cover film 33 of FPC 27 (back face of FPC 27) so as to cover anisotropic conductive material 34.

Figure 6A:
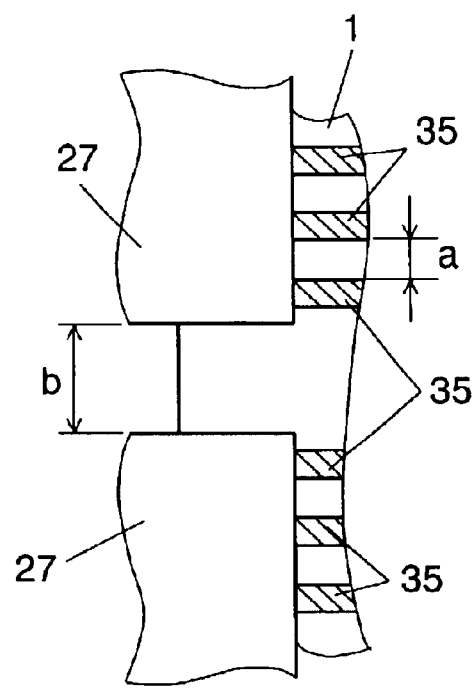
FIG. 6A is a plan view of a portion in which FPCs are attached to the front plate of the panel.
Figure 6B:
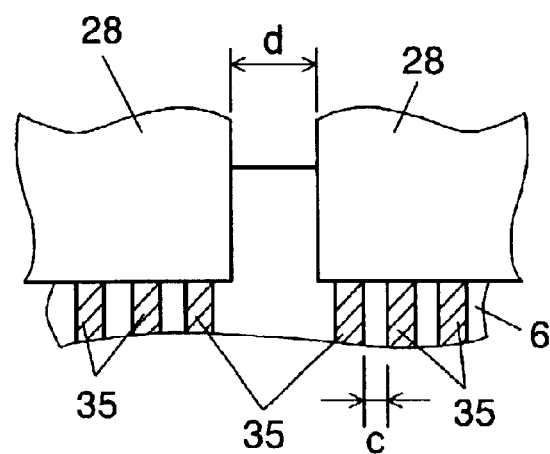
FIG. 6B is a plan view of a portion in which FPCs are attached to a back plate of the panel.

FIG. 6A is a plan view of a portion in which FPCs 27 are attached to front plate 1. In the drawing, adhesive 37 is omitted. Terminals 35 are formed in electrode lead group 29 at predetermined interval a. FPCs 27 are attached to corresponding electrode lead groups 29 at predetermined interval b. FIG. 6B is a plan view of a portion in which FPCs 28 are attached to back plate 6. Terminals 35 are formed in electrode lead group 30 at predetermined interval c. FPCs 28 are attached to corresponding electrode lead groups 30 at predetermined interval d. Electrode lead groups 29 or 30 can be disposed at regular intervals or irregular intervals. When the electrode lead groups are disposed at irregular intervals, interval b between FPCs 27 and interval d between FPCs 28 take values within a range instead of a fixed value. In many cases, the structure of the panel makes interval c between the terminals connecting to address electrodes 8 smaller than interval a between the terminals connecting to scan electrodes 2 and sustain electrodes 3. In many cases, interval d between FPCs 28 attached to the long side of back plate 6 is smaller than interval b between FPCs 27 attached to the short side of front plate 1. For an example of a 42-inch diagonal panel, intervals between the terminals a=300 µm and c=160 µm, and intervals between FPCs b=33 to 34 mm and d=15 to 22 mm.

Next, a description is provided of a method of connecting FPCs 27 and 28 to front plate 1 and back plate 6, respectively, referring to the drawings.

Step of Cleaning a Panel

Panel 11 shown in FIG. 4 is cleaned with water to remove dirt or contamination adhering to panel 11. Thereafter, the panel is dried.

Step of Heat-Bonding FPCs

FPCs are heat-bonded. Wiring patterns 32 of FPCs 27 and 28 and terminals 35 in electrode lead groups 29 and 30 are connected so as to sandwich anisotropic conductive material 34 therebetween. Because terminals 35 disposed at smaller intervals are more likely to be influenced by foreign matter, electrode lead groups 30 having terminals disposed at smaller intervals are heat-bonded first.

Figure 7:
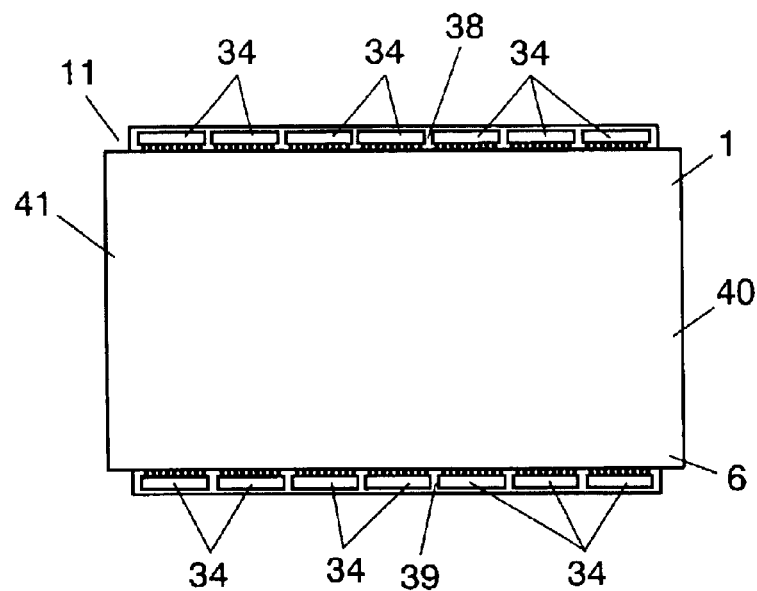
FIG. 7 is a plan view illustrating how anisotropic conductive material is provided on terminals in electrode lead groups on the back plate of the panel.
Figure 8:
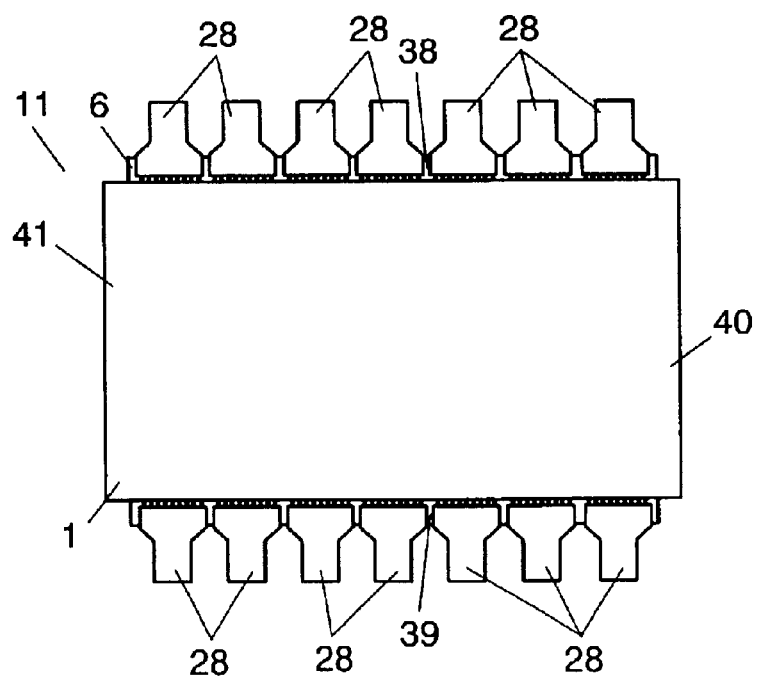
FIG. 8 is a plan view illustrating how FPCs are attached to the back plate of the panel.

First, as shown in FIG. 7, panel 11 is placed substantially horizontally with front plate 1 on the upper side and back plate 6 on the lower side. After organic matter is removed by ultraviolet (hereinafter abbreviated as "UV") cleaning, anisotropic conductive material 34 is placed on each electrode lead group 30 provided on sides 38 and 39 of panel 11. Subsequently, FPCs 28 are placed on corresponding anisotropic material 34. By heating the joint between terminals 35 in each electrode lead group 30 and the wiring patterns 32 of corresponding FPC 28 at a temperature of about 60° C., FPCs 28 are fixed temporarily. Thereafter, the joints between terminals 35 and the corresponding wiring patterns 32 are heated at a temperature of about 180° C. and heat-bonded. By these sub-steps, wiring patterns 32 of FPCs 28 and terminals 35 in electrode lead groups 30 on back plate 6 are connected so as to sandwich anisotropic conductive material 34 therebetween, as shown in FIG. 8.

Figure 9:
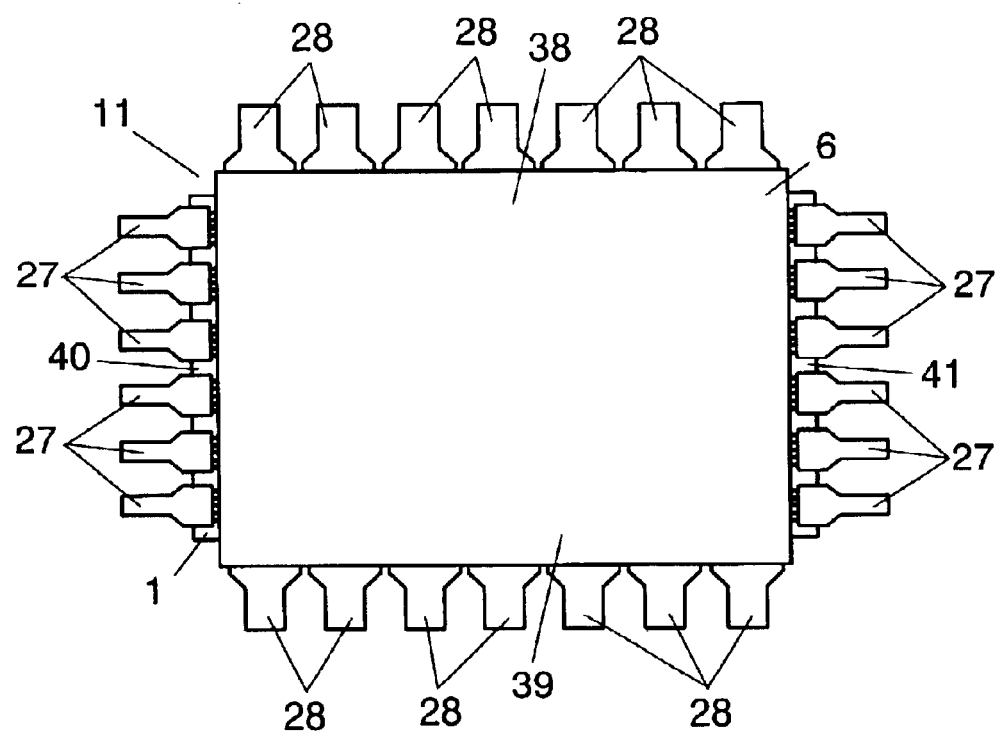
FIG. 9 is a plan view illustrating how FPCs are attached to the front and back plates of the panel.

Second, as shown in FIG. 9, panel 11 is reversed and placed substantially horizontally. FPCs 27 are heat-bonded to two sides 40 and 41 of panel 11, in the similar manner. By these sub-steps, wiring patterns 32 of FPCs 27 and terminals 35 in electrode lead groups 29 on front plate 1 are connected so as to sandwich anisotropic conductive material 34 therebetween.

In this manner, FPCs 27 are connected to terminals 35 on front plate 1 and FPCs 28 are connected to terminals 35 on back plate 6. Thus, the step of heat-bonding FPCs 27 and 28 is completed.

Step of Applying Adhesive

UV curing adhesive 37 is applied to the side of base film 31 (front face) and the side of cover film 33 (back face) of FPCs 27 and 28 attached to front plate 1 and back plate 6, respectively, using a nozzle for applying the adhesive. Then, the adhesive is cured.

Figure 10:
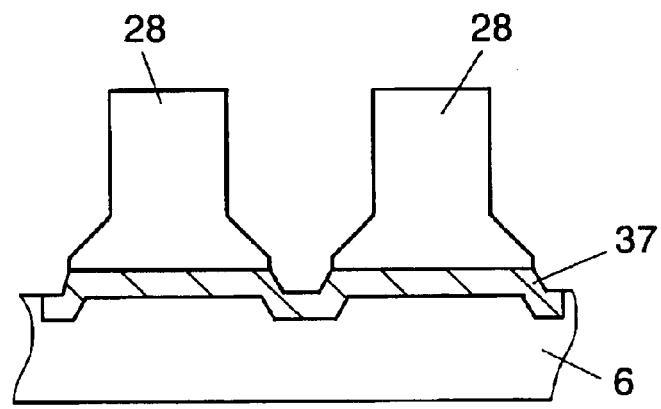
FIG. 10 is a plan view illustrating how adhesive is applied to the back faces of the FPCs.

First, a first adhesive-applying step is performed. When the step of heat-bonding the FPCs is completed, panel 11 is placed substantially horizontally with back plate 6 on the upper side and front plate 1 on the lower side, as shown in FIG. 9. In this state, the regions to which the adhesive is to be applied are irradiated with UV rays. This UV ray irradiation operation removes organic matter and improves the surface wettability, thereby allowing the adhesive to closely adhere and spread easily. Thereafter, the nozzle is moved while discharging adhesive along sides 38 and 39 of panel 11, to apply adhesive 37 to the back faces of FPCs 28. At this time, when adhesive 37 is applied straight along the edges of back plate 6, it drips down from the spaces between FPCs 28. For this reason, the movement of the nozzle is controlled so that adhesive 37 is applied to back plate 6 in the spaces between FPCs 28, as shown in FIG. 10. However, because adhesive 37 applied to back plate 6 in the spaces between FPCs 28 is essentially unnecessary, the amount of adhesive 37 applied to back plate 6 can be reduced or eliminated by moving the nozzle fast in application of adhesive 37 to back plate 6.

Figure 11:
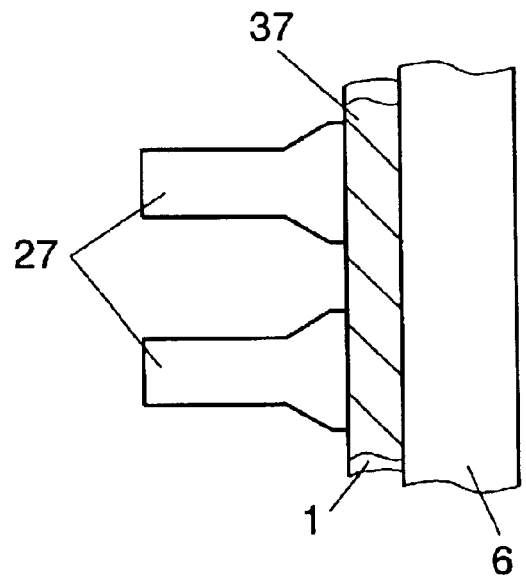
FIG. 11 is a plan view illustrating how adhesive is applied to the front faces of the FPCs.

Subsequently, the nozzle is moved straight along sides 40 and 41 of panel 11 while discharging adhesive to apply adhesive 37 to the front faces of FPCs 27, as shown in FIG. 11.

After completion of the first adhesive-applying adhesive-applying step in which adhesive 37 is applied to the above predetermined portions of panel 11 placed substantially horizontally with back plate 6 on the upper side and front plate 1 on the lower side, applied adhesive 37 is cured by UV irradiation.

Second, a second adhesive-applying step is performed. Panel 11 is reversed. While the panel is placed substantially horizontally with back plate 6 on the lower side and front plate 1 on the upper side, the nozzle is moved straight along sides 38 and 39 of panel 11 to apply adhesive 37 to the front faces of FPCs 28 in a manner like that shown in FIG. 11. Subsequently, the nozzle is moved along sides 40 and 41 to apply adhesive 37 to the back faces of FPCs 27 in a manner like that shown in FIG. 10. After completion of the second adhesive-applying step, adhesive 37 is cured by UV irradiation.

In application of adhesive 37 in the first and second adhesive-applying steps, two nozzles can be used to apply adhesive 37 to sides 38 and 39 at the same time, or one nozzle can be used to apply adhesive 37 to sides 38 and 39 sequentially. These methods apply to sides 40 and 41.

In this manner, wiring patterns 32 of FPCs 27 and terminals 35 connecting to scan electrodes 2 or sustain electrodes 3 are electrically connected, and wiring patterns 32 of FPCs 28 and terminals 35 connecting to address electrodes 8 are electrically connected. Further, FPCs 27 and 28 are fixed to front plate 1 and back plate 6, respectively, by adhesive 37. Thus, the step of applying adhesive is completed.

Figure 12:
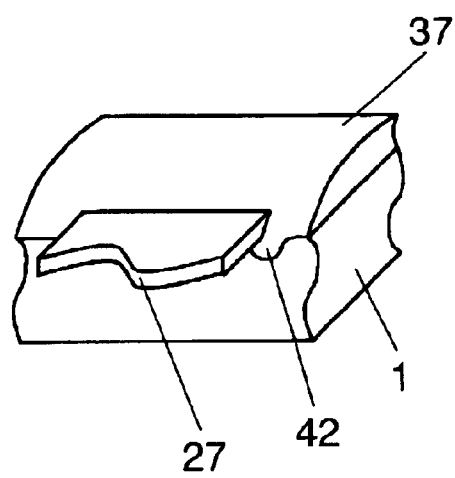
FIG. 12 is a perspective view illustrating how a protrusion is formed by applied adhesive that intrudes into the back face of an FPC.

Because FPCs 27 and 28 are disposed at predetermined intervals b and d, respectively, a long period of time taken from application to curing of adhesive 37 causes adhesive 37 to intrude into the face opposite to the applied faces of FPCs 27 and 28 or to drip down therefrom. For example, as shown in FIG. 12, when a predetermined period of time has elapsed after application of adhesive 37 to the front face of FPC27, adhesive 37 may intrude into the back face of FPC 27, drip down, and form protrusion 42. When adhesive 37 is further applied to the back face of FPC 27 after adhesive 37 on the front face is cured in this state, protrusion 42 hinders the flow of adhesive 37 and produces air pockets therein. As a result, bubbles remain in adhesive 37. When an excessive amount of adhesive 37 intrudes into the back faces of FPCs 27, it may drip down to the manufacturing device. Similar phenomenon occurs in application of adhesive 37 to the back faces of FPCs 27. In this case, an amount of adhesive 37 sufficient to securely cover the joints between FPCs 27 and front plate 1 is applied from the back face to the front faces of FPCs 27. For this reason, a long period of time elapsing after application may cause adhesive 37 to drip down from the side faces of FPCs 27 and adhere to the manufacturing device or other components. In some cases, wiping drips of adhesive 37 is required. It is found that the above phenomena, such as intrusion and drip of adhesive 37, are more likely to occur in the side having FPCs disposed at larger intervals than in the side having FPCs disposed at smaller intervals. In fact, it is obvious in the above 42-inch diagonal panel in which interval b between FPCs 27 is larger than interval d between FPCs 28 that intrusion or drip of adhesive 37 is more likely to occur between FPCs 27 than FPCs 28.

In this embodiment, in application of adhesive 37 to panel 11, adhesive 37 is applied to sides 38 and 39 having FPCs 28 disposed at smaller intervals first, and then applied to sides 40 and 41 having FPCs 27 disposed at larger intervals. The reason why adhesive 37 is applied in this order is as follows. Because sides 38 and 39 have FPCs 28 disposed at smaller intervals, intrusion or drip of adhesive 37 is unlikely to occur in these sides. On the other hand, because a period of time taken from application to curing of adhesive 37 is short for sides 40 and 41, adhesive 37 can be cured before intrusion of adhesive 37 occurs. Therefore, intrusion of adhesive 37, a cause of drip of or bubbles in adhesive 37, can be inhibited in any side. However, when difference in intervals between FPCs is negligible and thus there is no difference in likelihoods that drip or intrusion of adhesive 37 occurs, adhesive can be applied to either side first. For example, when one nozzle is used for application, adhesive 37 can be applied to either of FPTs 27 on side 40 or FPTs 27 on side 41 first.

As mentioned above, when adhesive is applied to the front face and back faces of FPCs, application of the adhesive to the side having FPCs disposed at smaller intervals first and then to the side having FPCs disposed at larger intervals can inhibit intrusion of adhesive 37, i.e. a cause of drip of and bubbles in adhesive 37.

Next, a description is provided of another exemplary embodiment of the present invention with reference to the accompanying drawings. Described in the first exemplary embodiment is a panel for the dual scanning system. Described in the followings is a panel for the so-called single scanning system in which all scan electrodes are sequentially scanned.

Figure 13A:
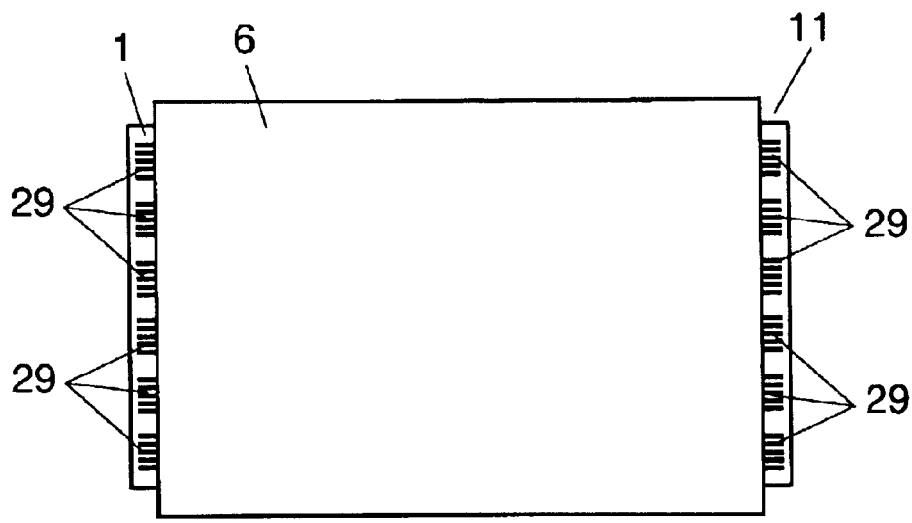
FIG. 13A is a plan view of a panel in accordance with another exemplary embodiment of the present invention seen from a back face thereof before attachment of FPCs.
Figure 13B:
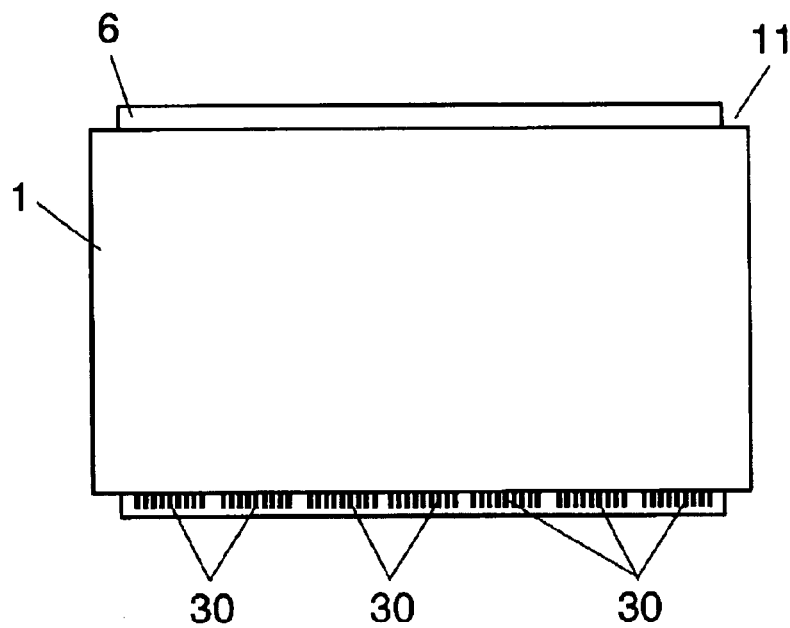
FIG. 13B is a plan view of the panel of the above embodiment of the present invention seen from a front face thereof before attachment of FPCs.
Figure 14:
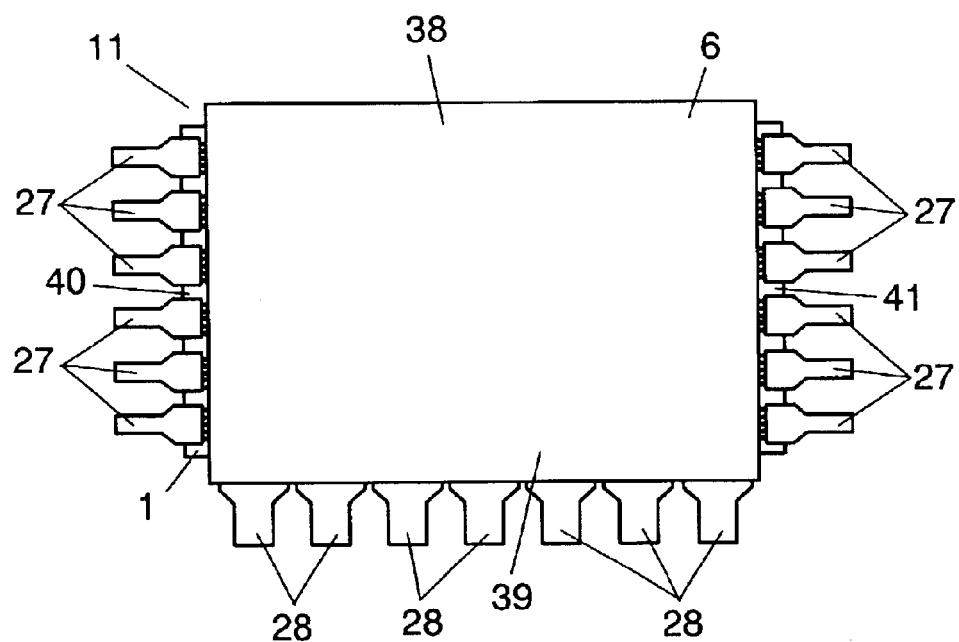
FIG. 14 is a plan view illustrating how FPCs are attached to front and back plates of the panel.

FIG. 13 are plan views each illustrating panel 11 before attachment of FPCs 27 or 28. FIG. 13A is a drawing of panel 11 seen from a back face thereof. FIG. 13B is a drawing of panel 11 seen from a front face thereof. Front plate 1 and back plate 6 of panel 11 are shaped substantially rectangular and have long sides and short sides. As shown in FIG. 13A, electrode lead groups 29 are disposed on the right and left edges, i.e. the short sides of front plate 1, where a predetermined number of terminals that connect to scan electrodes 2 or sustain electrodes formed horizontally like stripes are arranged. These electrode lead groups 29 form a plurality of blocks. As shown in FIG. 14, each FPC 27 is connected to each electrode lead group 29. As shown in FIG. 13B, electrode lead groups 30 are disposed on the bottom edge, i.e. one of the long sides of back plate 6, where a predetermined number of terminals that connect to address electrodes 8 formed vertically like stripes are arranged. These electrode lead groups 30 form a plurality of blocks. As shown in FIG. 14, each FPC 28 is connected to each electrode lead group 30.

Interval a between terminals 35 provided in electrode lead group 29, interval b between FPCs 27 attached to corresponding electrode lead groups 29, interval c between terminals provided in electrode lead group 30, and interval d between FPCs 28 attached to corresponding electrode lead groups 30 are substantially the same as those shown in FIGS. 6A and 6B. For an example of a 42-inch diagonal panel, intervals between the terminals a=300 $\mu$m and c=160 $\mu$m, and intervals between FPCs b=33 to 34 mm and d=15 to 22 mm.

Next, a description is provided of a method of connecting FPCs 27 and 28 to front plate 1 and back plate 6, respectively, referring to the drawings.

Steps of Cleaning a Panel and Heat-Bonding FPCs

These steps are substantially the same as those described above. In other words, after panel 11 is cleaned with water and dried, FPCs 28 are heat-bonded to corresponding electrode lead groups 30 having terminals disposed at smaller intervals and then FPCs 27 are heat-bonded to corresponding electrode lead groups 29. Thus, as shown in FIG. 14, FPCs 27 are connected to terminals 35 on the right and left edges of front plate 1 and FPCs 28 are connected to terminals 35 on the bottom edge of back plate 6.

Step of Applying Adhesive

For the joint between FPCs 27 and front plate 1 and the joint between FPCs 28 and back plate 6, UV curing adhesive 37 is applied to the side of base film 31 and the side of cover film 33 of FPCs 27 and 28, and the applied adhesive cured.

First, a first adhesive-applying step is performed. When the step of heat-bonding the FPCs is completed, panel 11 is placed substantially horizontally with back plate 6 on the upper side and front plate 1 on the lower side. In this state, the regions to which the adhesive is to be applied are irradiated with UV rays. This UV ray irradiation operation removes organic matter and improves the surface wettability, thereby allowing the adhesive to closely adhere and spread easily. Thereafter, a nozzle is moved while discharging the adhesive along long side 39 of panel 11, to apply adhesive 37 to the back faces of FPCs 28, as shown in FIG. 10.

Subsequently, the nozzle is moved straight along short sides 40 and 41 of panel 11 while discharging adhesive 37 to apply the adhesive to the front faces of FPCs 27, as shown in FIG. 11.

After completion of the first adhesive-applying step in which adhesive 37 is applied to the above predetermined portions of panel 11 placed substantially horizontally with back plate 6 on the upper side and front plate 1 on the lower side, adhesive 37 applied to sides 39 through 41 is cured by UV irradiation.

Second, a second adhesive-applying step is performed. Panel 11 is reversed. While panel 11 is placed substantially horizontally, the nozzle is moved straight along long side 39 of panel 11 to apply adhesive 37 to the front faces of FPCs 28 in a manner like that shown in FIG. 11. Subsequently, the nozzle is moved along short sides 40 and 41 of panel 11 to apply adhesive 37 to the back faces of FPCs 27 in a manner like that shown in FIG. 10. After completion of the above second adhesive-applying step, adhesive 37 applied to sides 39 through 41 is cured by UV irradiation.

In application of adhesive 37 in the first and second adhesive-applying steps, two nozzles can be used to apply adhesive 37 to sides 40 and 41 at the same time, or one nozzle can be used to apply adhesive 37 to sides 40 and 41 sequentially.

When the first adhesive-applying step is performed using one nozzle with reference to FIG. 14, an example of application is as follows. First, the nozzle is moved along side 39 from the right end to the left end to apply adhesive 37 to the back faces of FPCs 28, and subsequently moved along side 40 from the bottom end to the top end to apply adhesive 37 to the front faces of FPCs 27. Next, after being moved along side 38 from the left end to the right end, the nozzle is moved along side 41 from the top end to the bottom end to apply adhesive 37 to the front faces of FPCs 27. Applying adhesive 37 to side 39 on which FPCs 28 are attached to back plate 6 first, and subsequently to sides 40 and 41 on which FPCs 27 are attached to front plate 1 so as to make a circuit of the periphery of panel 11 can reduce unnecessary movement of the nozzle and thus accomplish efficient application of adhesive 37. Likewise, when the second adhesive-applying step is performed using one nozzle, applying adhesive 37 to side 39 on which FPCs 28 are attached to back plate 6 first, and subsequently to sides 40 and 41 on which FPCs 27 are attached to front plate 1 so as to make a circuit of the periphery of panel 11 can reduce unnecessary movement of the nozzle and thus accomplish efficient application of adhesive 37.

In this manner, wiring patterns 32 of FPCs 27 and terminals 35 connecting to scan electrodes 2 or sustain electrodes 3 are electrically connected, and wiring patterns 32 of FPCs 28 and terminals 35 connecting to address electrodes 8 are electrically connected. Further, FPCs 27 and 28 are fixed to front plate 1 and back plate 6, respectively, by adhesive 37. Thus, the step of applying adhesive is completed.

In this embodiment, in application of adhesive 37 to panel 11, adhesive 37 is applied to side 39 having FPCs 28 disposed at smaller intervals first, and then applied to sides 40 and 41 having FPCs 27 disposed at larger intervals. The reason why adhesive 37 is applied in this order is as follows. Because side 39 has FPCs 28 disposed at smaller intervals, intrusion or drip of adhesive 37 is unlikely to occur in this side. On the other hand, because a period of time taken from application to curing of adhesive 37 is short for sides 40 and 41, adhesive 37 can be cured before intrusion thereof occurs. Thus, intrusion of adhesive 37, a cause of drip of or bubbles in adhesive 37, can be inhibited in any side.

As mentioned above, in application of adhesive to the front faces and back faces of FPCs, applying the adhesive to the side having FPCs disposed at smaller intervals first, and then to the side having FPCs disposed at larger intervals can inhibit intrusion of adhesive 37, i.e. a cause of drip of and bubbles in adhesive 37. When one nozzle is used, applying adhesive to a side having FPCs disposed at smaller intervals first, and then to another side so as to make a circuit of the periphery of the panel can reduce unnecessary movement of the nozzle and accomplish efficient application of the adhesive.

Materials of adhesive 37 usable in each of the above embodiments include acrylic UV curing adhesive essentially consisting of modified acrylate. The viscosity thereof is adjusted according to the size of panel 11 and the intervals between FPCs, as required. For example, in a 42-inch diagonal panel having an interval between FPCs 27 b=33 to 34 mm and an interval between FPCs d=15 to 22 mm, acrylic UV curing adhesives having viscosities ranging from 160,000 to 240,000 cp at room temperature can be applied and cured without drip or intrusion thereof.

As the material of adhesive 37, silicone resin can also be used. In this case, after application, the silicone resin is cured by heating it to a temperature of about 50° C., for example. Alternatively, when a room temperature curing silicone resin is used, it can be dried naturally simply by leaving it at room temperature after application. The viscosity of the silicone resin is adjusted according to the size of panel 11 and the intervals between FPCs, as required.

In each of the above embodiments, after adhesive 37 is applied while panel 11 is placed substantially horizontally with back plate 6 on the upper side and front plate 1 on the lower side, adhesive 37 is applied while panel is reversed and placed substantially horizontally again. In other words, after the first adhesive application step is performed, the second adhesive application step is performed. This is because the first adhesive application step is performed while the panel is disposed as it is in the manufacturing process that has previously been performed. Even when the first and second adhesive application steps are performed in reverse order, the present invention can be implemented and substantially the same advantages can be obtained.

In the above embodiments, descriptions are provided of the cases where a plurality of terminals are formed on each of three sides (two short sides and one long side) or four sides (two short sides and two long sides) of a panel. However the present invention can also apply to a panel for single scanning, for example, in which the scan electrodes and sustain electrodes are lead on one of the short sides to form terminals. In other words, the present invention can apply to a panel having a plurality of terminals on each of at least two sides of a plurality of sides. Further, the present invention can apply to a panel having a plurality of terminals on each of at least one of long sides and at least one of short sides.

As obvious from the above descriptions, the method of manufacturing a plasma display device of the present invention can inhibit intrusion of adhesive, a cause of drip of and bubbles in the adhesive, allowing appropriate application of the adhesive with high workability.

What is claimed is:
1. A method of manufacturing a plasma display device, the device comprising:

(i) a panel having sides, each of at least two of said sides terminals thereon; and (ii) circuit boards connected to said terminals;

said method comprising:

applying adhesive to front faces and back faces of said circuit boards such that said adhesive is first applied to one of said sides having a first group of said circuit boards disposed at a smaller interval, and then applied to another one of said sides having a second group of said circuit boards disposed at a larger interval.

2. A method of manufacturing a plasma display device, the device comprising:

(i) a panel having opposed first and second substrates, each of said first and second substrates having terminals thereon;

(ii) first circuit boards connected to said terminals on said first substrate; and (iii) second circuit boards connected to said terminals on said second substrate, wherein an interval between said second circuit boards is smaller than an interval between said first circuit boards;

said method comprising:

a first adhesive-applying step of applying adhesive to back faces of said second circuit boards and then to front faces of said first circuit boards; and a second adhesive-applying step of applying adhesive to front faces of said second circuit boards and then to back faces of said first circuit boards.

3. The method of manufacturing a plasma display device according to claim 2, including performing said first adhesive-applying step and then performing said second adhesive-applying step.

4. A method of manufacturing a plasma display device, the device comprising:

(i) a panel having sides, each of at least two of said sides having terminals thereon; and (ii) circuit boards connected to said terminals;

said method comprising:

applying adhesive to front faces and back faces of said circuit boards such that said adhesive is first applied to one of said sides having a first group of said circuit boards disposed at a smaller interval, and then applied to remaining sides so as to create a circuit along a periphery of said panel.

5. A method of manufacturing a plasma display device, the device comprising:

(i) a panel having opposed first and second substrates, each of said first and second substrates having terminals thereon;

(ii) first circuit boards connected to said terminals on said first substrate; and (iii) second circuit boards connected to said terminals on said second substrate, wherein an interval between said second circuit boards is smaller than an interval between said first circuit boards;

said method comprising:

a first adhesive-applying step of applying adhesive to back faces of said second circuit boards and then to front faces of said first circuit boards so as to create a circuit along a periphery of said panel; and a second adhesive-applying step of applying adhesive to front faces of said second circuit boards and then to back faces of said first circuit boards so as to create a circuit along a periphery of said panel.

6. The method of manufacturing a plasma display device according to claim 5, including performing said first adhesive-applying step and then performing said second adhesive-applying step.

7. A method of manufacturing a plasma display device, the device comprising:

(i) a panel having long sides on which circuit boards are disposed at a smaller interval, and short sides on which circuit board are deposed at a larger interval, at least one of said long sides and at least one of said short sides having terminals thereon; and (ii) circuit boards connected to said terminals;

said method comprising:

applying adhesive to front faces and back faces of said circuit boards such that said adhesive is first applied to one of said long sides and then applied to one of said short sides.

8. A method of manufacturing a plasma display device, the device comprising:

(i) a panel having opposed first and second substrates, each of said first and second substrates having long sides on which circuit boards are disposed at a smaller interval, and short sides on which circuit boards are deposed at a larger interval, at least one of said short sides of said first substrate and at least one of said long sides of said second substrate having terminals thereon;

(ii) first circuit boards connected to said terminals on said first substrate; and (iii) second circuit boards connected to said terminals on said second substrate;

said method comprising:

a first adhesive-applying step of applying adhesive to back faces of said second circuit boards connected to said terminals on said at least one of said long sides of said second substrate, and then to front faces of said first circuit boards connected to said terminals on said at least one of said short sides of said first substrate; and a second adhesive-applying step of applying adhesive to front faces of said second circuit boards connected to said terminals on said at least one of said long sides of said second substrate, and then to back faces of said first circuit boards connected to said terminals on said at least one of said short sides of said first substrate.

9. The method of manufacturing a plasma display device according to claim 8, including performing said first adhesive-applying step and then performing said second adhesive-applying step.

10. A method of manufacturing a plasma display device, the device comprising:

(i) a panel having long sides on which circuit boards are disposed at a smaller interval, and short sides on which circuit boards are deposed at a larger interval, at least one of said long sides and at least one of said short sides having terminals thereon; and (ii) circuit boards connected to said terminals;

said method comprising:

applying adhesive to front faces and back faces of said circuit boards such that said adhesive is first applied to one of said long sides, and then applied to remaining sides so as to create a circuit along a periphery of said panel.

11. A method of manufacturing a plasma display device, the device comprising:

(i) a panel having opposed first and second substrates, each of said first and second substrates having long sides on which circuit boards are disposed at a smaller interval, and short sides on which circuit boards are disposed at a larger interval, at least one of said short sides of said first substrate and at least one of said long sides of said second substrate having terminals thereon;

(ii) first circuit boards connected to said terminals on said first substrate; and (iii) second circuit boards connected to said terminals on said second substrate;

said method comprising:

a first adhesive-applying step of applying adhesive to back faces of said second circuit boards connected to said terminals on said at least one of said long sides of said second substrate, and then to front faces of said first circuit boards so as to create a circuit along a periphery of said panel; and a second adhesive-applying step of applying adhesive to front faces of said second circuit boards connected to said terminals on said at least one of said long sides of said second substrate, and then to back faces of said first circuit boards so as to create a circuit along a periphery of said panel.

12. The method of manufacturing a plasma display device according to claim 11, including performing said first adhesive-applying step and then performing said second adhesive-applying step.

* * * * *

UNITED STATES PATENT AND TRADEMARK OFFICE
CERTIFICATE OF CORRECTION

PATENT NO.        : 6,923,703 B2                              Page 1 of 1
APPLICATION NO.   : 10/354988
DATED             : August 2, 2005
INVENTOR(S)       : Hiroyuki Furukawa It is certified that error appears in the above-identified patent and that said Letters Patent is hereby corrected as shown below:

TITLE PAGE

ITEM (57), Abstract, line 3, delete "a plurality of".

ITEM (57), Abstract, line 3, delete "formed".

ITEM (57), Abstract, line 4, delete "a plurality of".

ITEM (57), Abstract, line 4, delete "to be".

ITEM (57), Abstract, line 5, delete the second occurrence "the".

ITEM (57), Abstract, line 7, "is applied" should read --is first applied--.

ITEM (57), Abstract, line 8, "then to one" should read --then applied to one--.

ITEM (57), Abstract, line 11, "thereof" should read --of the plasma display panel--.

Signed and Sealed this

Thirtieth Day of October, 2007

JON W. DUDAS
*Director of the United States Patent and Trademark Office*